(12) United States Patent
Wang et al.

(10) Patent No.: US 11,658,116 B2
(45) Date of Patent: May 23, 2023

(54) INTERCONNECTS ON MULTIPLE SIDES OF A SEMICONDUCTOR STRUCTURE

(71) Applicant: International Business Machines Corporation, Armonk, NY (US)

(72) Inventors: Junli Wang, Slingerlands, NY (US); Albert Chu, Nashua, NH (US); Dechao Guo, Niskayuna, NY (US); Brent Anderson, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 165 days.

(21) Appl. No.: 17/189,528

(22) Filed: Mar. 2, 2021

(65) Prior Publication Data
US 2022/0285259 A1 Sep. 8, 2022

(51) Int. Cl.
*H01L 21/00* (2006.01)
*H01L 23/528* (2006.01)
(Continued)

(52) U.S. Cl.
CPC ...... *H01L 23/528* (2013.01); *H01L 21/76898* (2013.01); *H01L 21/823871* (2013.01);
(Continued)

(58) Field of Classification Search
CPC ............. H01L 23/528; H01L 21/76898; H01L 21/823871
See application file for complete search history.

(56) References Cited

U.S. PATENT DOCUMENTS 6,316,981 B1   11/2001   Rao et al.
6,355,950 B1   3/2002   Livengood et al.
(Continued)

FOREIGN PATENT DOCUMENTS

| CN | 102844862 A | * | 12/2012 | ............. H01L 21/50 |
| WO | WO-2011130078 A1 | * | 10/2011 | ............. H01L 21/50 |
| WO | WO-2022051028 A1 | * | 3/2022 | ......... H01L 21/4853 |

OTHER PUBLICATIONS

J. Ryckaert et al., "Extending the Roadmap Beyond 3nm through System Scaling Boosters: A Case Study on Buried Power Rail and Backside Power Delivery,"Electron Devices Technology and Manufacturing Conference (EDTM), 2019, pp. 50-52.

*Primary Examiner* — Laura M Menz
(74) *Attorney, Agent, or Firm* — L. Jeffrey Kelly; Ryan, Mason & Lewis, LLP

(57) ABSTRACT

A semiconductor structure comprises a front-end-of-line region comprising two or more devices, a first back-end-of-line region on a first side of the front-end-of-line region, the first back-end-of-line region comprising a first set of interconnects for at least a first subset of the two or more devices in the front-end-of-line region, and a second back-end-of-line region on a second side of the front-end-of-line region opposite the first side of the front-end-of-line region, the second back-end-of-line region comprising a second set of interconnects for at least a second subset of the two or more devices in the front-end-of-line region. The semiconductor structure also comprises one or more passthrough vias disposed in the front-end-of-line region, each of the one or more passthrough vias connecting at least one of the first set of interconnects of the first back-end-of-line region to at least one of the second set of interconnects of the second back-end-of-line region.

8 Claims, 11 Drawing Sheets

(51) Int. Cl.
  *H01L 27/092*    (2006.01)
  *H01L 21/8238*   (2006.01)
  *H01L 23/522*    (2006.01)
  *H01L 21/768*    (2006.01)
  *H01L 23/48*     (2006.01)

(52) U.S. Cl.
  CPC ........ *H01L 23/481* (2013.01); *H01L 23/5226* (2013.01); *H01L 27/092* (2013.01)

(56) References Cited

U.S. PATENT DOCUMENTS

| | | | |
|---|---|---|---|
| 6,448,168 B1 | 9/2002 | Rao et al. | |
| 7,410,884 B2 | 8/2008 | Ramanathan et al. | |
| 7,485,968 B2 * | 2/2009 | Enquist | H01L 25/0657 |
| | | | 438/455 |
| 7,683,458 B2 | 3/2010 | Akram et al. | |
| 7,956,442 B2 | 6/2011 | Hsu et al. | |
| 8,299,583 B2 | 10/2012 | Zhu | |
| 8,525,342 B2 * | 9/2013 | Chandrasekaran | H01L 21/50 |
| | | | 257/773 |
| 8,912,091 B2 | 12/2014 | Burnham et al. | |
| 9,123,702 B2 | 9/2015 | Chen et al. | |
| 9,673,220 B1 * | 6/2017 | Stamper | H01L 27/124 |
| 9,818,800 B2 | 11/2017 | Sekar et al. | |
| 11,195,795 B1 * | 12/2021 | Anderson | H01L 21/76816 |
| 11,489,111 B2 * | 11/2022 | Chen | H01L 45/1206 |
| 2011/0233617 A1 | 9/2011 | Or-Bach et al. | |
| 2011/0241082 A1 | 10/2011 | Bernstein et al. | |
| 2011/0248403 A1 * | 10/2011 | Chandrasekaran | H01L 24/94 |
| | | | 257/E21.705 |
| 2015/0091066 A1 * | 4/2015 | Lee | H01L 25/0657 |
| | | | 257/369 |
| 2018/0366445 A1 * | 12/2018 | Dote | H01L 21/8221 |
| 2020/0251483 A1 * | 8/2020 | Utsumi | H01L 24/16 |
| 2021/0125981 A1 * | 4/2021 | Or-Bach | H01L 27/0207 |
| 2021/0249302 A1 * | 8/2021 | Anderson | H01L 21/76805 |
| 2021/0280638 A1 * | 9/2021 | Li | H01L 45/16 |
| 2021/0313265 A1 * | 10/2021 | Anderson | H01L 21/7688 |
| 2021/0384123 A1 * | 12/2021 | Anderson | H01L 23/5226 |
| 2022/0013521 A1 * | 1/2022 | Zhang | H01L 29/66553 |
| 2022/0037205 A1 * | 2/2022 | Anderson | H01L 21/76834 |
| 2022/0037306 A1 * | 2/2022 | You | H01L 23/5226 |
| 2022/0285259 A1 * | 9/2022 | Wang | H01L 23/528 |
| 2022/0310908 A1 * | 9/2022 | Chen | H01L 45/128 |
| 2022/0328474 A1 * | 10/2022 | Or-Bach | H01L 27/11 |

* cited by examiner

INTERCONNECTS ON MULTIPLE SIDES OF A SEMICONDUCTOR STRUCTURE

BACKGROUND

The present application relates to semiconductors, and more specifically, to techniques for forming semiconductor structures. Semiconductors and integrated circuit chips have become ubiquitous within many products, particularly as they continue to decrease in cost and size. There is a continued desire to reduce the size of structural features and/or to provide a greater number of structural features for a given chip size. Miniaturization, in general, allows for increased performance at lower power levels and lower cost. Present technology is at or approaching atomic level scaling of certain micro-devices such as logic gates, field-effect transistors (FETs), and capacitors.

SUMMARY

Embodiments of the invention provide techniques for forming interconnect wiring on two sides of a semiconductor structure.

In one embodiment, a semiconductor structure comprises a front-end-of-line region comprising two or more devices. The semiconductor structure also comprises a first back-end-of-line region on a first side of the front-end-of-line region, the first back-end-of-line region comprising a first set of interconnects for at least a first subset of the two or more devices in the front-end-of-line region. The semiconductor structure further comprises a second back-end-of-line region on a second side of the front-end-of-line region opposite the first side of the front-end-of-line region, the second back-end-of-line region comprising a second set of interconnects for at least a second subset of the two or more devices in the front-end-of-line region. The semiconductor structure further comprises one or more passthrough vias disposed in the front-end-of-line region, each of the one or more passthrough vias connecting at least one of the first set of interconnects of the first back-end-of-line region to at least one of the second set of interconnects of the second back-end-of-line region.

In another embodiment, a semiconductor structure comprises a stacked front-end-of-line region, the stacked front-end-of-line comprising a first front-end-of-line region comprising two or more devices and a second front-end-of-line region comprising two or more devices. The semiconductor structure also comprises a first back-end-of-line region on a first side of the stacked front-end-of-line region, the first back-end-of-line region comprising a first set of interconnects for at least a first subset of the two or more devices in at least one of the first front-end-of-line region and the second front-end-of-line region of the stacked front-end-of-line region. The semiconductor structure further comprises a second back-end-of-line region on a second side of the stacked front-end-of-line region opposite the first side of the stacked front-end-of-line region, the second back-end-of-line region comprising a second set of interconnects for at least a second subset of the two or more devices in at least one of the first front-end-of-line region and the second front-end-of-line region of the stacked front-end-of-line region. The semiconductor structure further comprises one or more passthrough vias disposed in the stacked front-end-of-line region, each of the one or more passthrough vias passing through the first front-end-of-line region and the second front-end-of-line region, at least one of the one or more passthrough vias connecting at least one of the first set of interconnects of the first back-end-of-line region to at least one of the second set of interconnects of the second back-end-of-line region.

In another embodiment, an integrated circuit comprises a semiconductor structure comprising two or more devices, a first set of interconnects for the two or more devices on a first side of the semiconductor structure, a second set of interconnects for the two or more devices on a second side of the semiconductor structure opposite the first side of the semiconductor structure, and one or more passthrough vias disposed in the semiconductor structure. At least one of the one or more passthrough vias extends from the first side of the semiconductor structure to the second side of the semiconductor structure and connects one or more first interconnects on a first side of the semiconductor structure and one or more second interconnects on a second side of the semiconductor structure opposite the first side of the semiconductor structure.

In another embodiment, a method comprises forming two or more devices in a semiconductor structure, forming one or more passthrough vias in the semiconductor structure, forming a first set of interconnects on a first side of the semiconductor structure, and forming a second set of interconnects on a second side of the semiconductor structure. At least one of the one or more passthrough vias connects at least one of the first set of interconnects and at least one of the second set of interconnects.

In another embodiment, a method comprises performing first front-end-of-line processing to form two or more devices in a first front-end-of-line region of a semiconductor structure and performing second front-end-of-line processing to form two or more devices in a second front-end-of-line region of the semiconductor structure. The method also comprises forming one or more passthrough vias in the first front-end-of-line region of the semiconductor structure and the second front-end-of-line region of the semiconductor structure. The method further comprises performing first back-end-of-line processing to form a first set of interconnects on a first side of the semiconductor structure, and performing second back-end-of-line processing to form a second set of interconnects on a second side of the semiconductor structure opposite the first side of the semiconductor structure. At least one of the one or more passthrough vias connects at least one of the first set of interconnects and at least one of the second set of interconnects.

DETAILED DESCRIPTION

Illustrative embodiments of the invention may be described herein in the context of illustrative methods for forming interconnect wiring on two sides of a semiconductor structure, along with illustrative apparatus, systems and devices formed using such methods. However, it is to be understood that embodiments of the invention are not limited to the illustrative methods, apparatus, systems and devices but instead are more broadly applicable to other suitable methods, apparatus, systems and devices.

With continuous scaling, more and more devices (e.g., transistors) are packed into integrated circuit chips (e.g., into one or more 100 millimeter (mm)$^2$ chips). To provide desired functionality, the devices must be interconnected through wiring and routing. With an increased number of devices in an integrated circuit, more and more wiring and routing resources are required to precisely connect the integrated circuit as desired for a particular use case. Thus, for example, more and more metal layers may be needed to connect all of the devices in an integrated circuit.

In a conventional approach an integrated circuit may include front-end-of-line (FEOL) processing for fabricating devices (e.g., transistors, capacitors, resistors, etc.) on a wafer and BEOL processing for interconnecting such devices on the wafer. More particularly, BEOL processes are typically focused on forming metal interconnects between the different devices of an integrated circuit, whereas the fabrication of the different devices that make up the integrated circuit is typically done during FEOL processing.

In FEOL processing, devices such as complementary metal-oxide-semiconductor (CMOS) field-effect transistors (FET) devices are formed by a series of steps. For example, masking layers (e.g., photolithographic masks) may be used to form patterns on a semiconductor substrate or wafer. Such masking layers may be used to control or define specific regions where material is to be etched or removed, as well as to control or define specific regions where material is to be formed (e.g., through deposition, growth, etc.). In some cases, materials may be blanket deposited, followed by patterning of one or more masking layers to remove previously deposited materials in some areas while leaving the previously deposited material in other areas.

In BEOL processing, fabrication of an integrated circuit continues by forming interconnects through one or more layers of wiring and dielectric passivation layers over active devices in a FEOL region formed during the FEOL processing. Interconnections or interconnects may include metallic structures that are formed in multiple levels of interlayer dielectric (ILD) layers for electrically connecting the various devices in the FEOL region. Following FEOL and BEOL processing, a wafer may be separated or divided into multiple integrated circuit chips by dicing or other suitable techniques.

Figure 1:
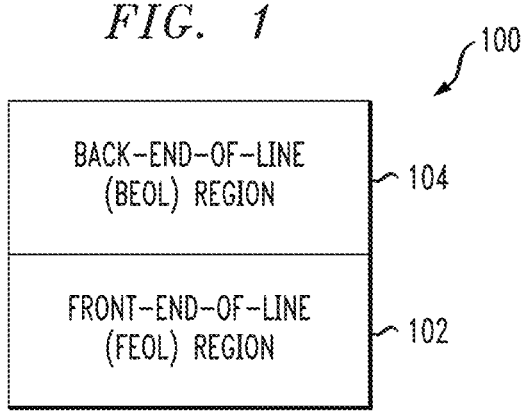
FIG. 1 depicts an integrated circuit structure including a front-end-of-line (FEOL) region and a back-end-of-line (BEOL) region on a first side of the FEOL region, according to an embodiment of the invention.

FIG. 1 illustrates a structure 100, which includes a FEOL region 102 and a BEOL region 104. The FEOL region 102 include various active devices (e.g., intrinsic CMOS devices). Middle-of-line contacts may be formed for such active devices prior to BEOL processing. The BEOL region 104 includes interconnects for the active devices in the FEOL region 102, which may include various metal wiring layers or levels (e.g., an M1, M2, etc. up to controlled collapse chip connection (C4) or flip chip bumps). The metal writing in the BEOL region 104 may include metal wiring for a power grid, as well as wire routing. As discussed above, with continuous scaling more and more active devices (e.g., billions of transistors) are being packed into several 100 mm$^2$ integrated circuit chips. The wiring has to perfectly connect all devices in the integrated circuit as needed. With continued scaling, more and more wiring and routing resources are required. Thus, the BEOL region 104 needs more and more metal layers being added up.

As shown in FIG. 1, the BEOL region 104 may be formed on a first or "front" side of the FEOL region 102. Illustrative embodiments provide techniques for leveraging a second or "back" side of the FEOL region 102 (e.g., the back side of the integrated circuit chip) to provide more routing resources. Illustrative embodiments further provide features for front and back side connections through passthrough vias formed in FEOL regions. Such double side (e.g., front and back side) wiring improves routing resources to enable vertical three-dimensional (3D) stacked devices.

Figure 2:
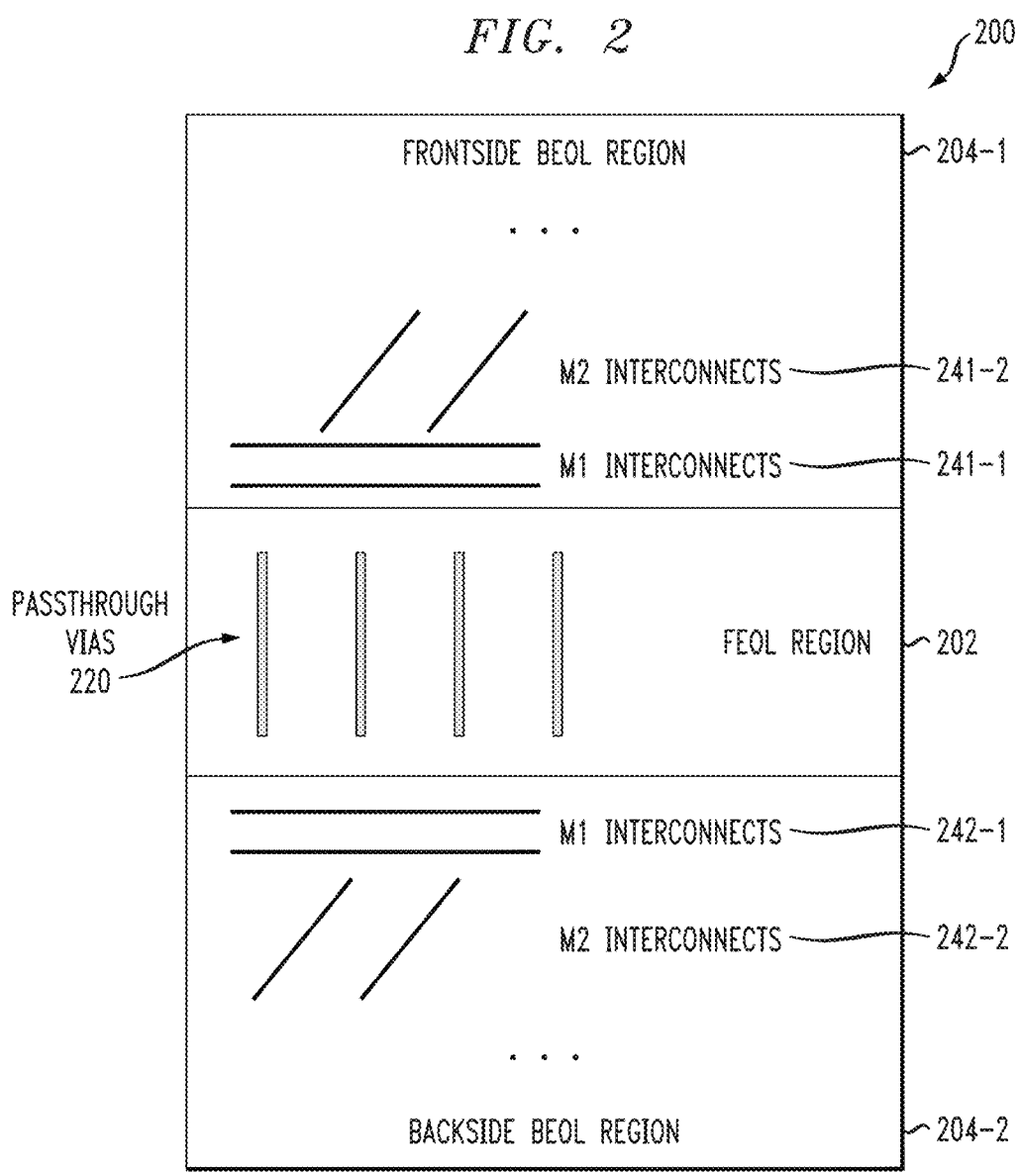
FIG. 2 depicts an integrated circuit structure including a FEOL region and first and second BEOL regions on first and second sides of the FEOL region, according to an embodiment of the invention.

FIG. 2 illustrates a structure 200 with first and second BEOL regions 204-1 and 204-2 on first and second ("front" and "back") sides of a FEOL region 202. The FEOL region 202 include various active devices (e.g., intrinsic CMOS devices), middle-of-line (MOL) contacts, etc. The FEOL region 202 further includes one or more passthrough vias 220 for connections between wires in the first or "frontside" BEOL region 204-1 and the second or "backside" BEOL region 204-2. The passthrough vias 220 are illustratively formed as self-aligned features between active devices in the FEOL region 202.

The frontside BEOL region 204-1 illustratively includes multiple metal wiring levels, shown in FIG. 2 as a first M1 metal wiring level 241-1 and a second M2 metal wiring level 241-2, all the way up to C4 bumps. The metal wiring in the frontside BEOL region 204-1 includes power grid and wire routing features. The backside BEOL region 204-2 also illustratively includes multiple metal wiring levels, shown in FIG. 2 as a first M-1 metal wiring level 242-1 and a second M-2 wiring level 242-2. It should be appreciated that while FIG. 2 shows an example where the backside BEOL region 204-2 includes multiple wiring layers (e.g., at least two metal layers 242-1 and 242-2 for wiring and routing), the backside BEOL region 204-2 may also or alternatively include just a single wiring layer (e.g., one metal layer used as a power rail).

The structure 200 includes two sides of the FEOL region 202 with metal wiring—the first side with frontside BEOL region 204-1 and the second side with the backside BEOL region 204-2. The self-aligned passthrough vias 220 provide front and back side wire connections. As will be described in further detail below, the self-aligned passthrough vias 220 may be formed during or after formation of the FEOL region 202. The self-aligned passthrough vias 220 may be formed by leveraging dummy gate structures in the FEOL region 202. The self-aligned passthrough vias 220 can be located within device-to-device boundaries in the FEOL region 202.

Figure 3:
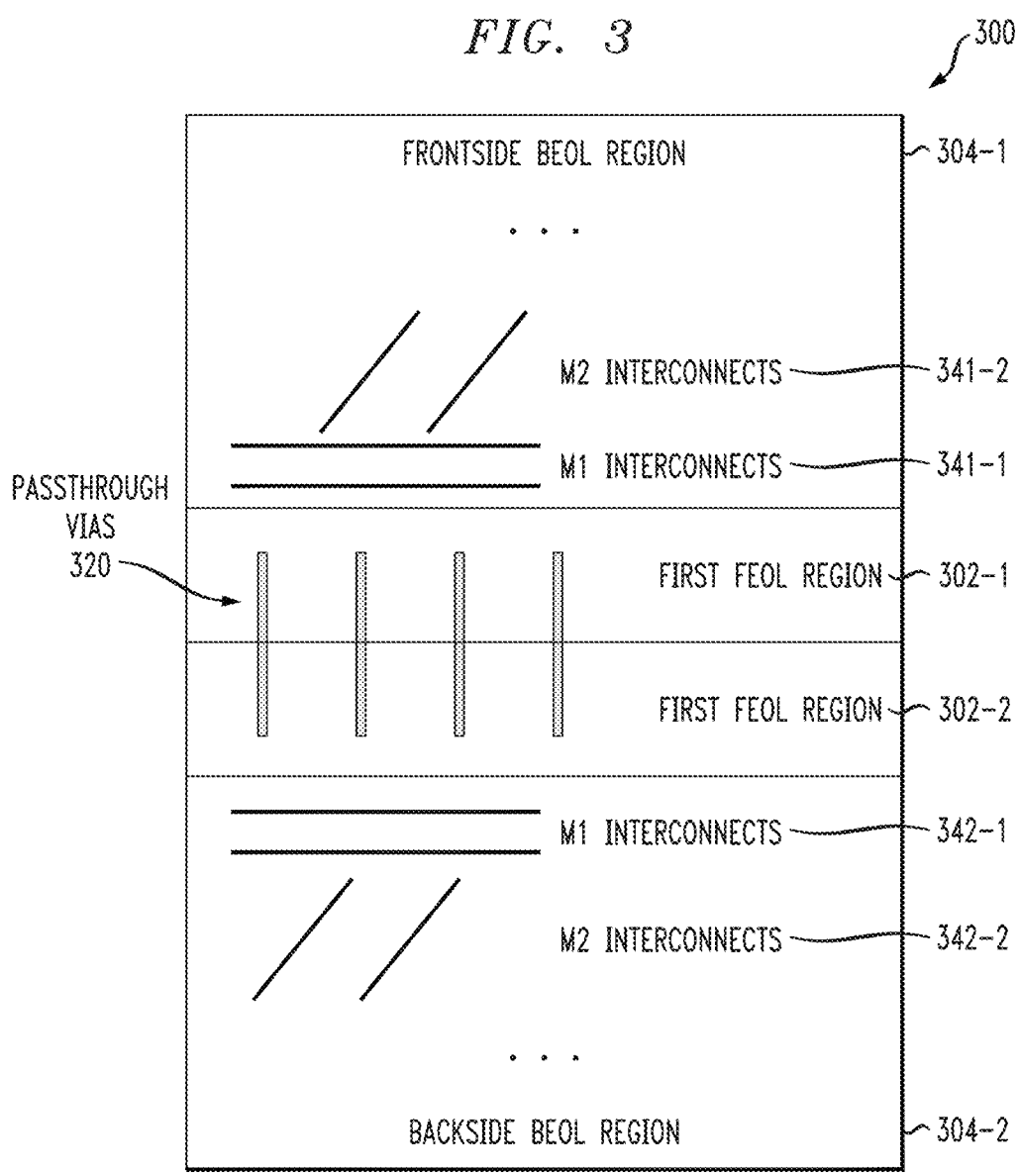
FIG. 3 depicts an integrated circuit structure including stacked FEOL regions and first and second BEOL regions on first and second sides of the stacked FEOL regions, according to an embodiment of the invention.

FIG. 3 illustrates a structure 300 with first and second BEOL regions 304-1 and 304-2 on first and second ("front" and "back") sides of stacked FEOL regions 202-1 and 202-2. The stacked FEOL regions include a first FEOL region 302-1 and a second FEOL region 302-2. In the stacked FEOL regions, the first FEOL region 302-1 may include monolithic devices of a first type with the second FEOL region 302-2 including monolithic devices of a second type. For example, the first FEOL region 302-1 may include only p-type field-effect transistors (PFETs) while the second FEOL region 302-2 includes only n-type field-effect transistors (NFETs), or vice versa. Similar to the structure 200, the structure 300 includes one or more passthrough vias 320 for connections between wires in the first or "frontside" BEOL region 304-1 and the second or "backside" BEOL region 304-2. The passthrough vias 320 are illustratively formed as self-aligned features between active devices in the first FEOL region 302-1 and the second FEOL region 302-2.

The frontside BEOL region 304-1 illustratively includes multiple metal wiring levels, shown in FIG. 3 as a first M1 metal wiring level 341-1 and a second M2 metal wiring level 341-2, all the way up to C4 bumps. The metal wiring in the frontside BEOL region 304-1 includes power grid and wire routing features. The backside BEOL region 304-2 also illustratively includes multiple metal wiring levels, shown in FIG. 3 as a first M-1 metal wiring level 342-1 and a second M-2 wiring level 342-2. It should be appreciated that while FIG. 3 shows an example where the backside BEOL region 304-2 includes multiple wiring layers (e.g., at least two metal layers 342-1 and 342-2 for wiring and routing), the backside BEOL region 304-2 may also or alternatively include just a single wiring layer (e.g., one metal layer used as a power rail).

The structure 300 includes stacked FEOL regions 202-1 and 202-2 (e.g., providing sequentially integrated stacked devices) with metal wiring on two sides—the first side with frontside BEOL region 304-1 and the second side with the backside BEOL region 304-2. The self-aligned passthrough vias 320 provide front and back side wire connections. As will be described in further detail below, the self-aligned passthrough vias 320 may be formed during or after the stacked FEOL formation (e.g., during or after formation of the first and second FEOL regions 302-1 and 302-2). The self-aligned passthrough vias 320 may be formed by leveraging dummy gate structures in the first and second FEOL regions 302-1 and 302-2. The self-aligned passthrough vias 320 can be located within device-to-device boundaries in the first and second FEOL regions 302-1 and 302-2.

FIGS. 4-12 illustrate a process flow for forming the structure 200 of FIG. 2.

Figure 4:
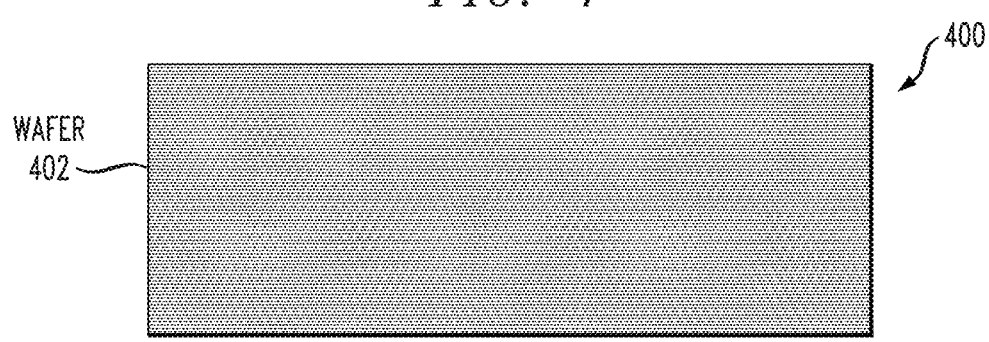
FIG. 4 depicts a side cross-sectional view of a wafer, according to an embodiment of the invention.

FIG. 4 shows a cross-sectional view 400 of a wafer 402, which may be a semiconductor structure formed of bulk silicon (Si), although other suitable materials may be used, such as various silicon-containing materials. Illustrative examples of silicon-containing materials suitable for the wafer 402 include, but are not limited to, Si, silicon germanium (SiGe), silicon germanium carbide (SiGeC), silicon carbide (SiC), polysilicon, epitaxial silicon, amorphous silicon, and multi-layers thereof. Although silicon is the predominantly used semiconductor material in wafer fabrication, alternative semiconductor materials can be employed, such as, but not limited to, germanium (Ge), gallium arsenide (GaAs), gallium nitride (GaN), cadmium telluride (CdTe) and zinc selenide (ZnSe). In an alternate embodiment, the wafer 402 may be silicon-on-insulator (SOI) wafer. As is known in the art, a SOI wafer includes a SOI layer separated from a substrate by a buried insulator. Suitable substrate materials include, but are not limited to, Si, strained Si, silicon carbide (SiC), Ge, SiGe, SiGeC, Si alloys, Ge alloys, GaAs, indium arsenide (InAs), indium phosphide (InP), or any combination thereof. Suitable dielectric materials for the buried insulator include, but are not limited to, an oxide material such as silicon dioxide ($SiO_2$). When the buried insulator is an oxide, the buried insulator may also be referred to as a buried oxide or BOX.

Figure 5:
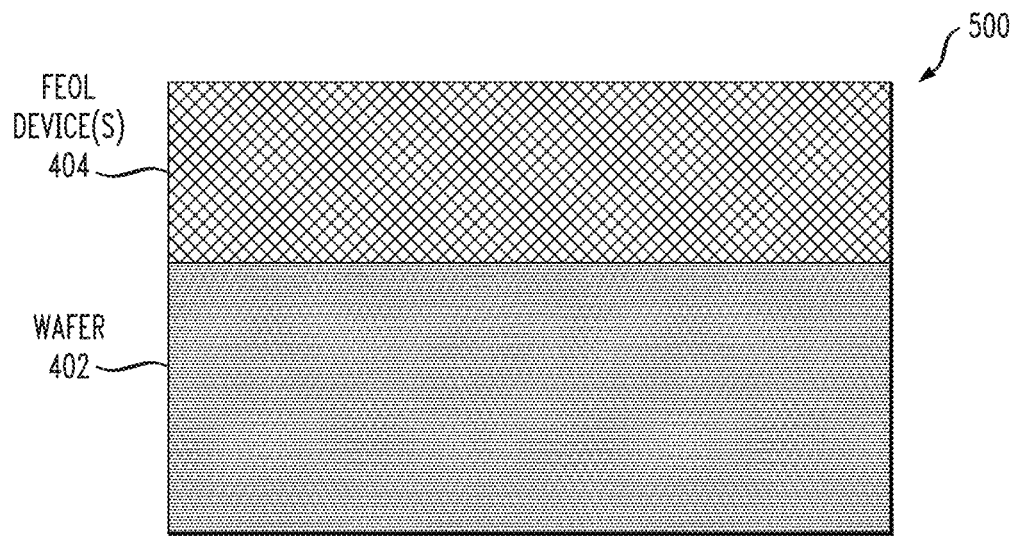
FIG. 5 depicts a side cross-sectional view of the FIG. 4 structure following formation of FEOL devices in a FEOL region over a top surface of the wafer, according to an embodiment of the invention.

FIG. 5 shows a cross-sectional view 500 of one or more FEOL devices 404 formed over a top surface of the wafer 402. The FEOL devices 404, by way of example may comprise one or more fin field-effect transistors (FinFETs) or nanosheet transistors. Before the advent of FinFET arrangements, CMOS devices were typically substantially planar along the surface of a semiconductor substrate such as the wafer 402, with the exception of the FET gate disposed over the top of the channel. FinFETs utilize a vertical channel structure, increasing the surface area of the channel exposed to the gate. Thus, in FinFET structures the gate can more effectively control the channel, as the gate extends over more than one side or surface of the channel. In some FinFET arrangements, the gate encloses three surfaces of the three-dimensional channel, rather than being disposed over just the top surface of a traditional planar channel. Nanosheet transistors utilize stacked nanosheet channels formed over a semiconductor substrate such as wafer 402. Stacked nanosheets may be two-dimensional nanostructures, such as sheets having a thickness range on the order of 1 to 100 nanometers (nm). Nanosheets and nanowires are viable options for scaling to 7 nm and beyond. A general process flow for formation of a nanosheet stack involves removing sacrificial layers, which may be formed of silicon germanium (SiGe), between sheets of channel material, which may be formed of silicon (Si).

Figure 6A:
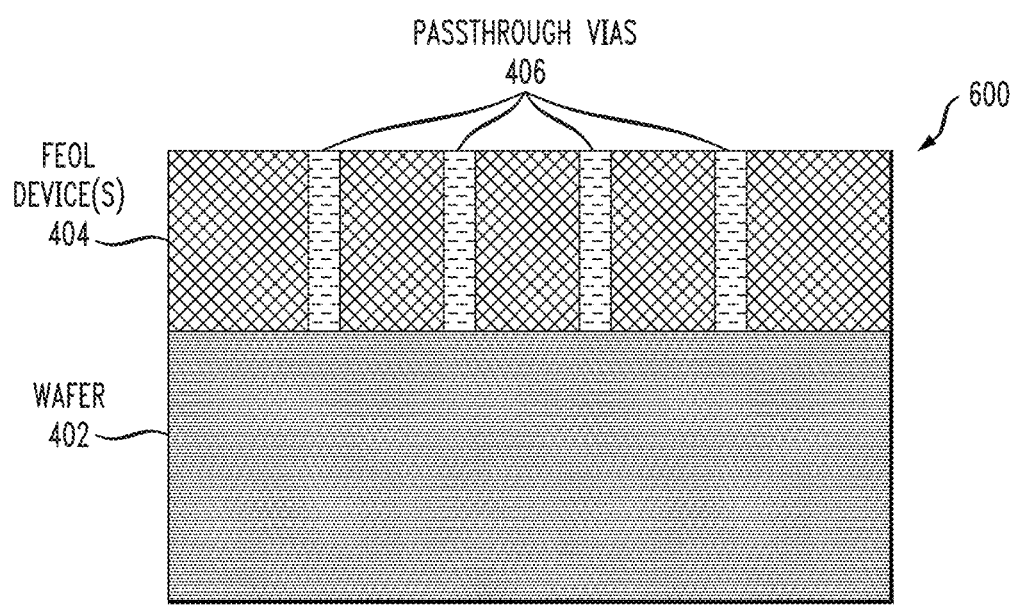
FIG. 6A depicts a side cross-sectional view of the FIG. 5 structure following formation of passthrough vias, according to an embodiment of the invention.
Figure 6B:
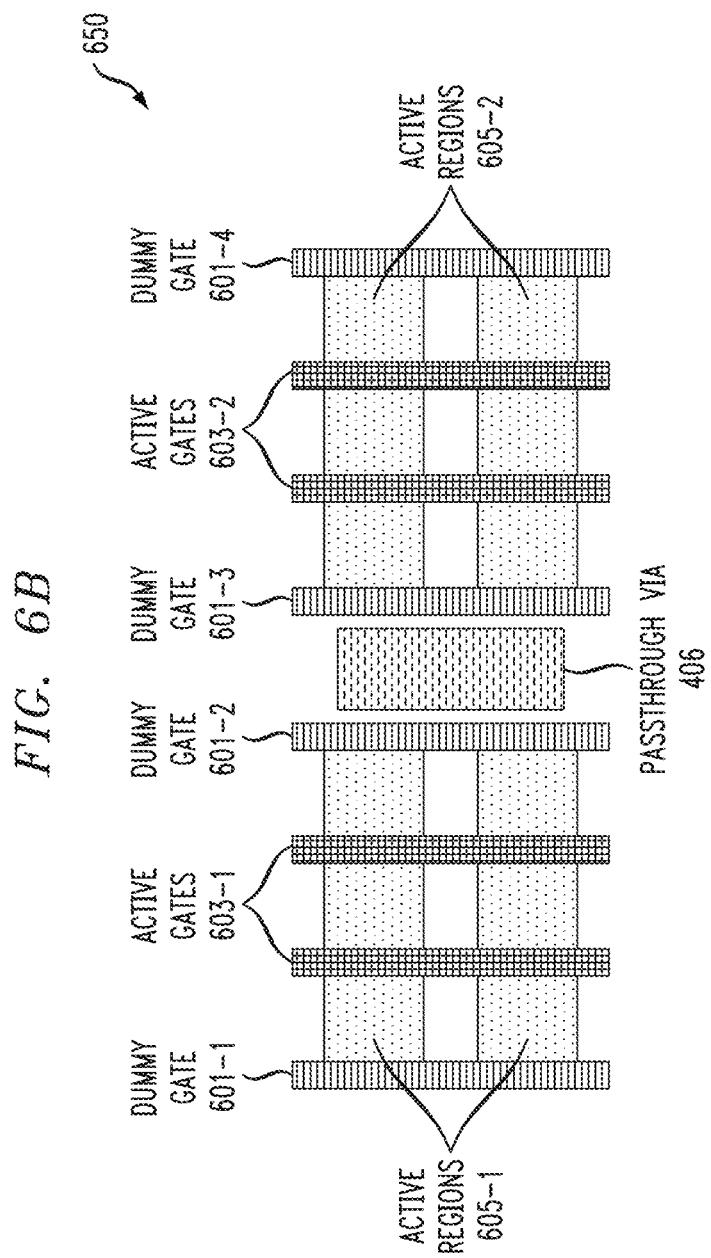
FIG. 6B depicts a top-down view of formation of a passthrough via, according to an embodiment of the invention.

FIG. 6A shows a cross-sectional view 600 following formation of passthrough vias 406 in the FEOL devices 404. The passthrough vias 406 may be formed at standard to standard cell boundaries in the FEOL devices 404, block to block boundaries in the FEOL devices, or in specially designed locations. FIG. 6B shows another view 650, illustrating formation of one of the passthrough vias 406 at a device boundary. More particularly, FIG. 6B shows dummy gates 601-1, 601-2, 601-3 and 601-4. Between the dummy gates 601-1 and 601-2, active gates 603-1 are formed for active regions 605-1 (e.g., of at least a first one of the FEOL devices 404). Between the dummy gates 601-3 and 601-4, activate gates 603-2 are formed for active regions 605-2 (e.g., of at least a second one of the FEOL devices 404). The passthrough via 406 shown in FIG. 6B leverages the dummy gates 601-2 and 601-3 are the device boundary to confine the passthrough via formation. The passthrough via 406 shown in FIG. 6B is self-aligned to the dummy gates 601-2 and 601-3. Although in FIG. 6B the passthrough via 406 is self-aligned to the device boundaries between dummy gate structures 601-2 and 601-3, as noted above passthrough vias may be formed at various specially designed locations in other embodiments.

Figure 7:
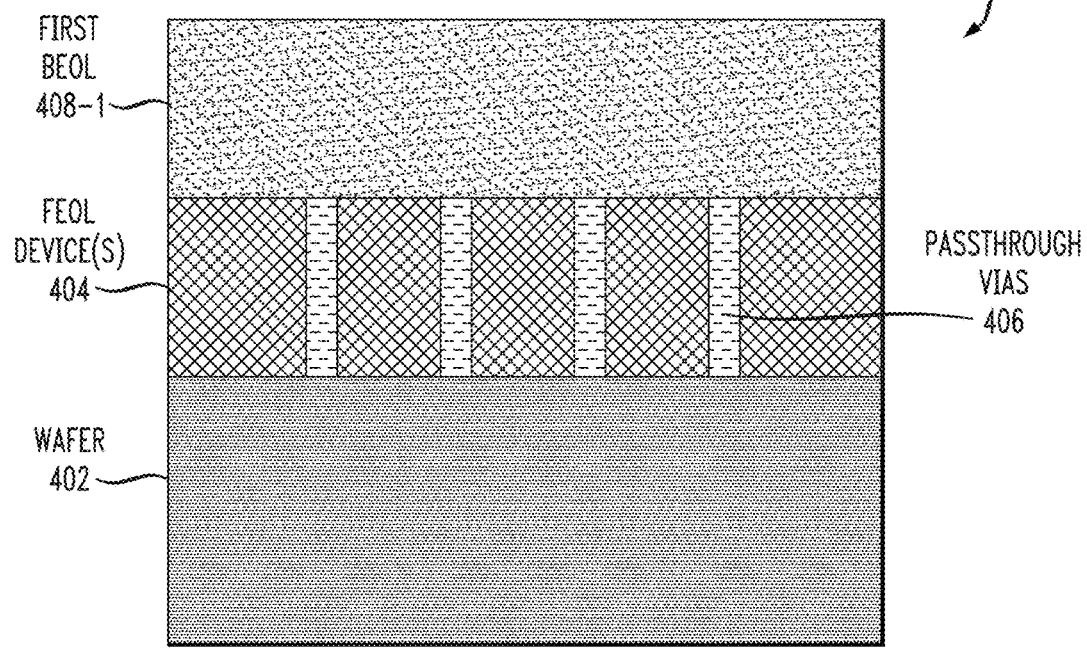
FIG. 7 depicts a side cross-sectional view of the FIG. 6A structure following formation of a first BEOL region on a first side of the FEOL region, according to an embodiment of the invention.

FIG. 7 shows a cross-sectional view 700 following formation of a first BEOL region 408-1 over the FEOL devices 404. The first BEOL region 408-1 illustratively includes BEOL interconnect wiring, C4 bump formation, etc. in a manner similar to that described above with respect to the first BEOL region 204-1 in structure 200.

Figure 8:
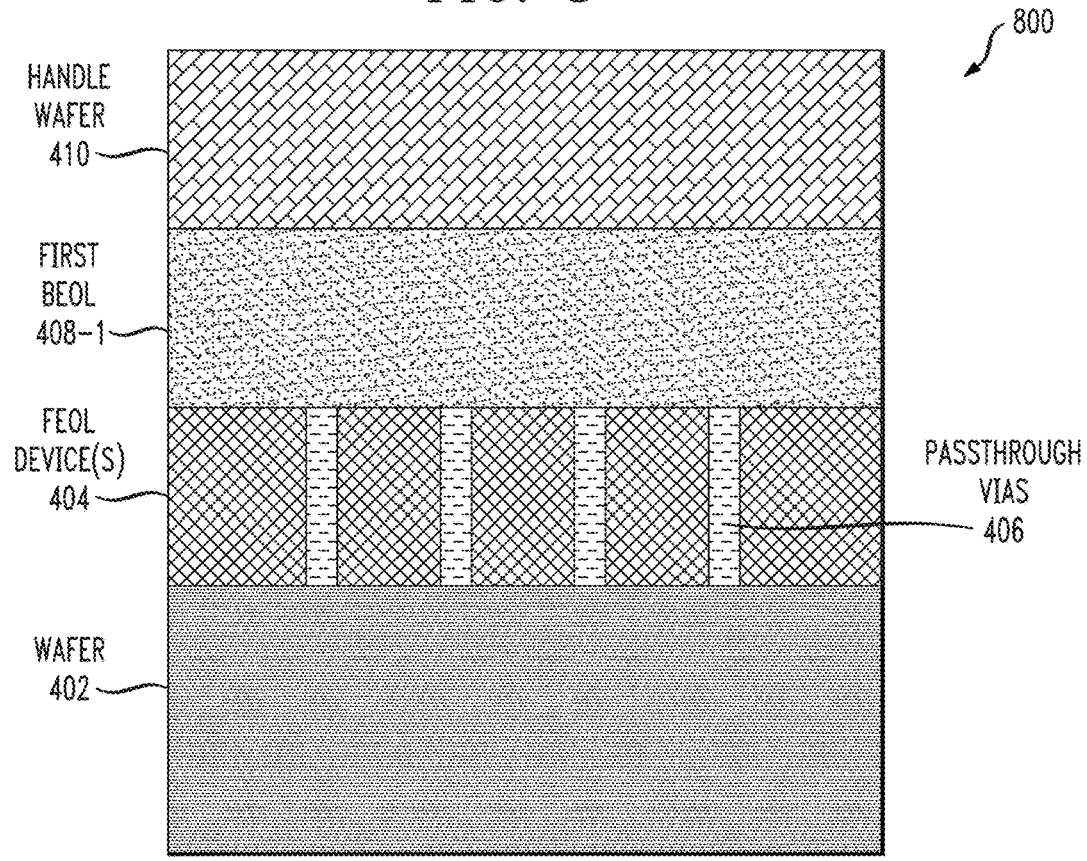
FIG. 8 depicts a side cross-sectional view of the FIG. 7 structure following bonding of a handle wafer to the first BEOL region, according to an embodiment of the invention.
Figure 9:
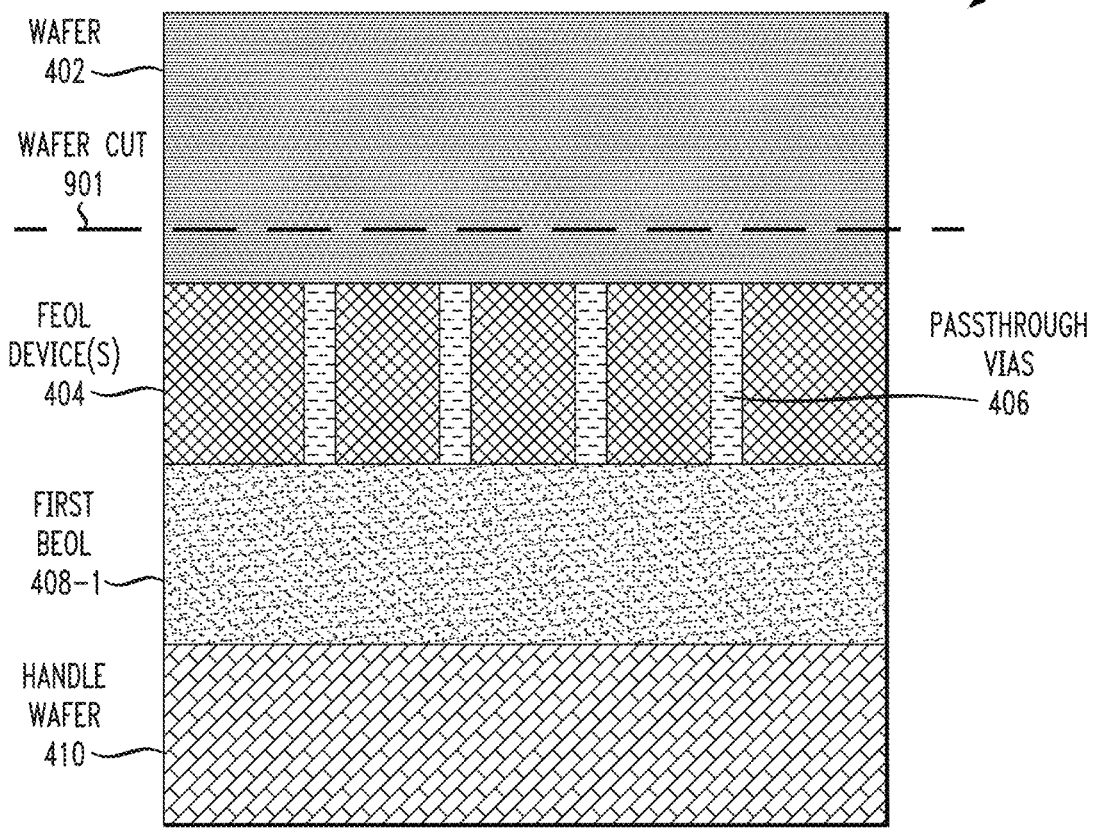
FIG. 9 depicts a side cross-sectional view of the FIG. 8 structure following flipping using the handle wafer, according to an embodiment of the invention.
Figure 10:
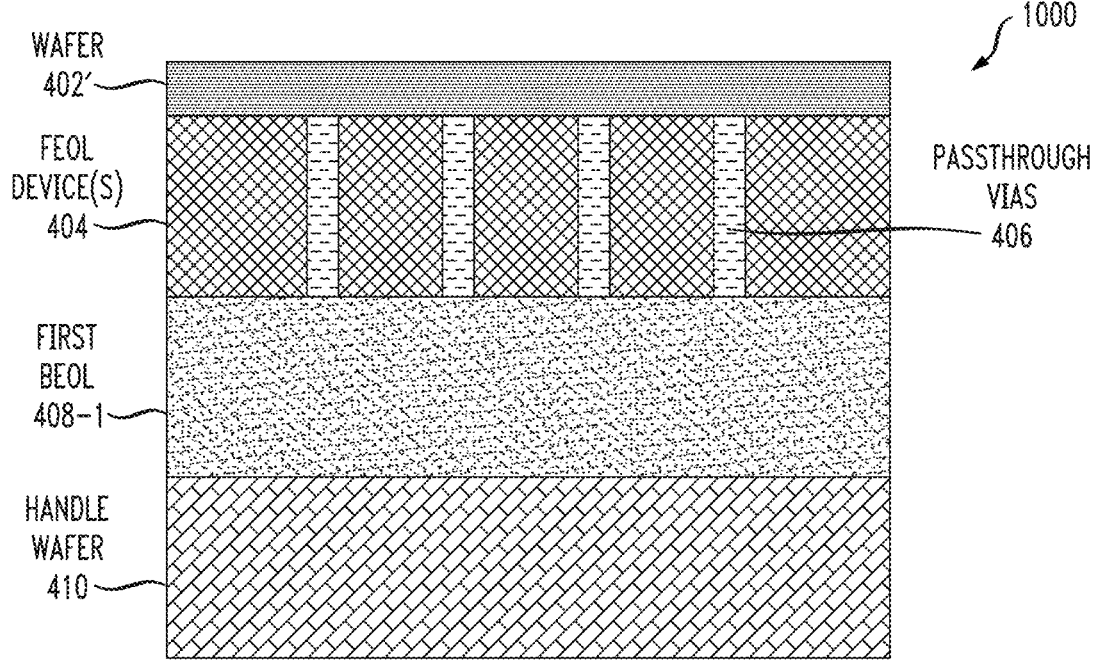
FIG. 10 depicts a side cross-sectional view of the FIG. 9 structure following cut of the wafer, according to an embodiment of the invention.
Figure 11:
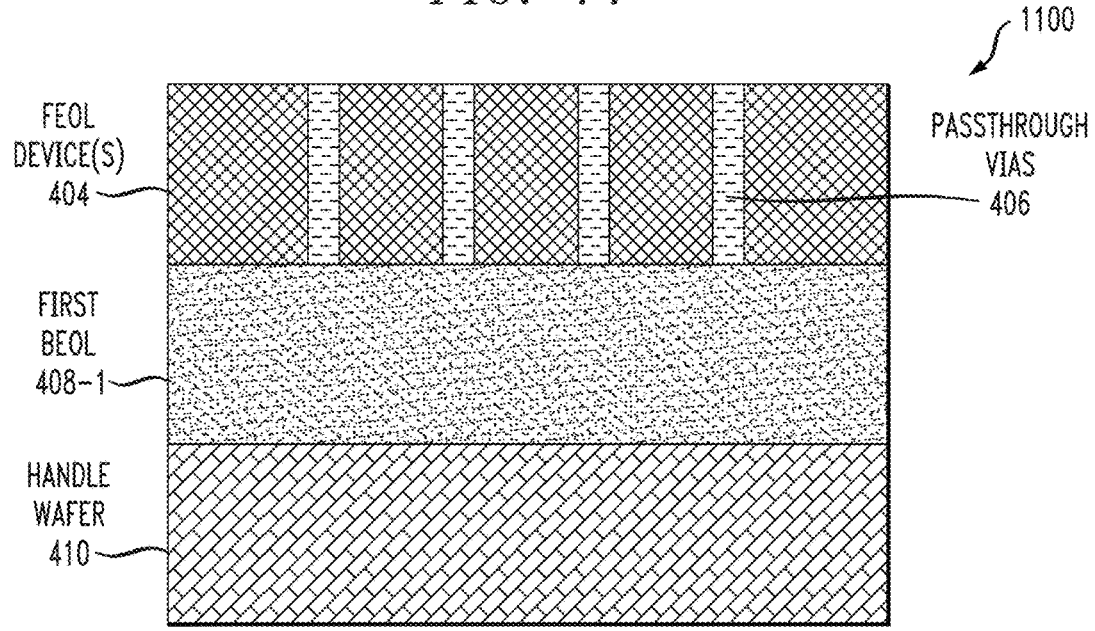
FIG. 11 depicts a side cross-sectional view of the FIG. 10 structure following thinning of remaining portions of the wafer, according to an embodiment of the invention.

FIG. 8 shows a cross-sectional view 800 following bonding of a handle wafer 410 to the first BEOL region 408-1. As illustrated in the cross-sectional view 900 of FIG. 9, the handle wafer 410 is used to flip the wafer 402. FIG. 9 further illustrates a wafer cut line 901. FIG. 10 shows a cross-sectional view 1000 following cutting of the wafer 402 along the wafer cut line 901, resulting in wafer 402'. FIG. 11 shows a cross-sectional view 1100 following thinning down to remove remaining portions of the wafer 402'.

Figure 12:
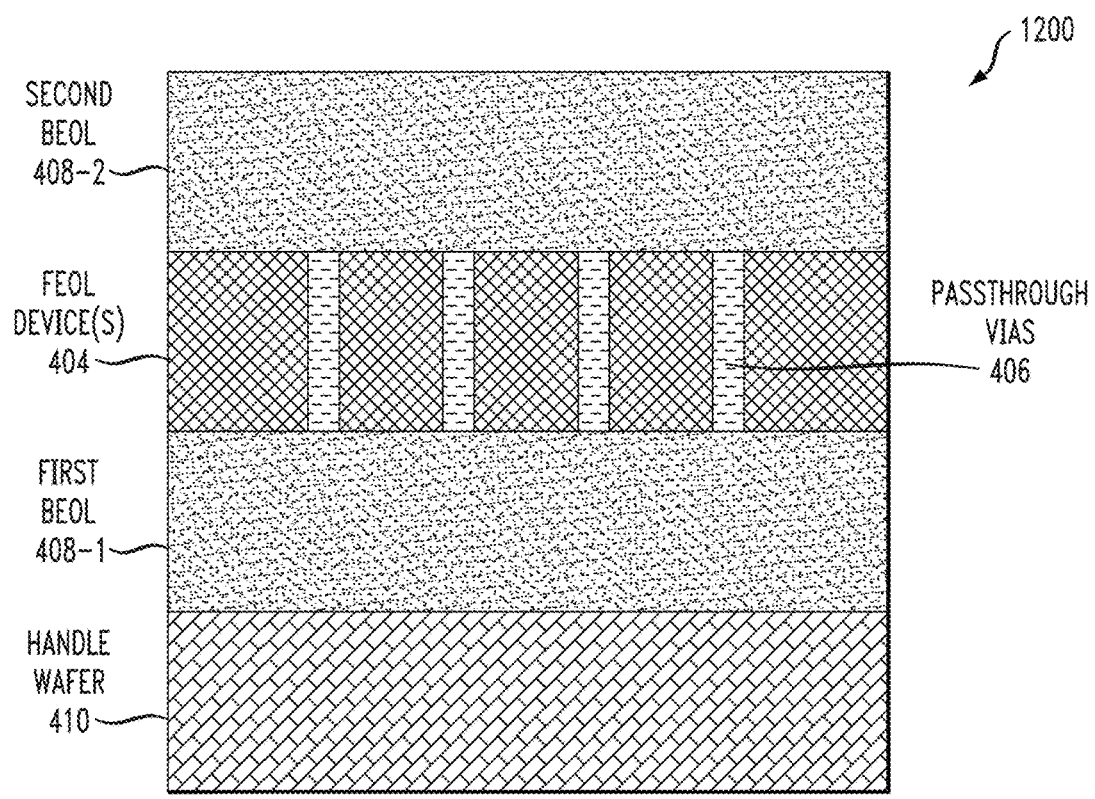
FIG. 12 depicts a side cross-sectional view of the FIG. 11 structure following formation of a second BEOL region on a second side of the FEOL region, according to an embodiment of the invention.

Following removal of the remaining portions of the wafer 402', a second BEOL region 408-2 is formed as shown in the cross-sectional view 1200 of FIG. 12. The second BEOL region 408-2 illustratively includes BEOL interconnect wiring, C4 bump formation, etc. in a manner similar to that described above with respect to the second BEOL region 204-2 in structure 200. The passthrough vias 406 provide for interconnection between wiring in the first BEOL region 408-1 and the second BEOL region 408-2.

FIGS. 4 and 13-20 illustrate a process flow for forming the structure 300 of FIG. 3.

Figure 13:
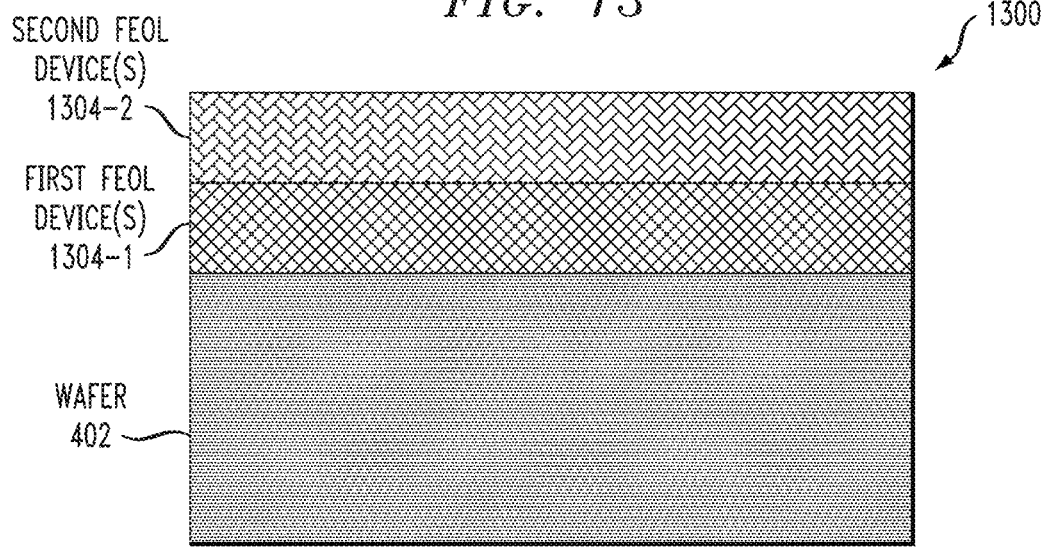
FIG. 13 depicts a side cross-sectional view of the FIG. 4 structure following formation of FEOL devices in stacked FEOL regions over a top surface of the wafer, according to an embodiment of the invention.

FIG. 4, as described above, shows a cross-sectional view 400 of a wafer 402. FIG. 13 shows a cross-sectional view 1300 illustrating stacked FEOL formation including first FEOL devices 1304-1 and second FEOL devices 1304-2. The first FEOL devices 1304-1 may comprise PFET devices while the second FEOL devices 1304-2 may comprise NFET devices, or vice versa (e.g., the first FEOL devices 1304-1 may comprise NFET devices while the second FEOL devices 1304-2 comprise PFET devices). The NFETs and PFETs in the first and second FEOL devices 1304-1 and 1304-2 may comprise FinFETs, nanosheet transistors, etc.

Figure 14:
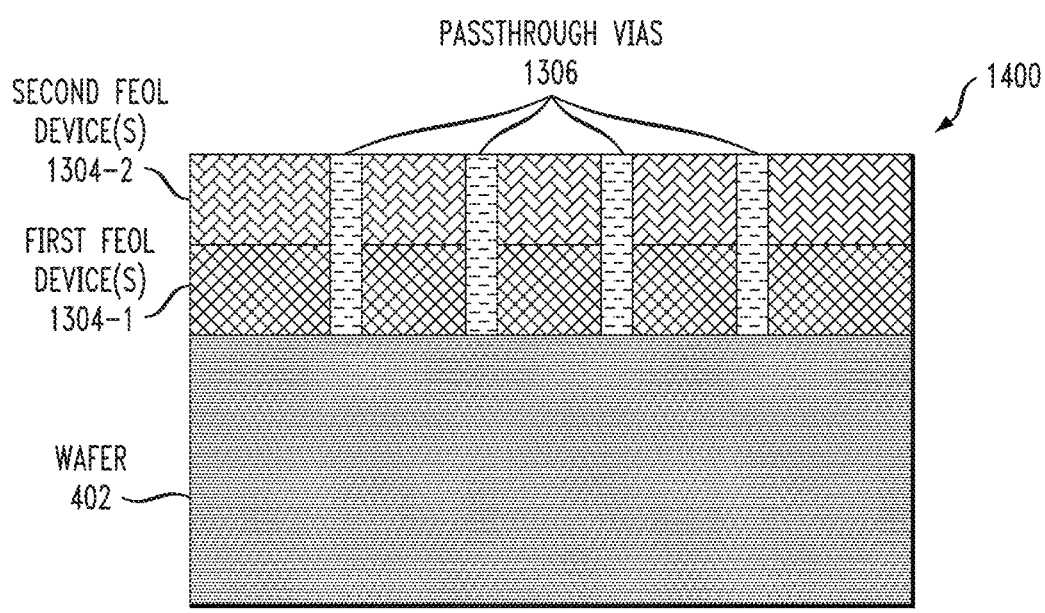
FIG. 14 depicts a side cross-sectional view of the FIG. 13 structure following formation of passthrough vias, according to an embodiment of the invention.

FIG. 14 shows a cross-sectional view 1400 following formation of passthrough vias 1306 through the first and second FEOL devices 1304-1 and 1304-2. The passthrough vias 1306 may be formed in a manner similar to that described above with respect to passthrough vias 406.

Figure 15:
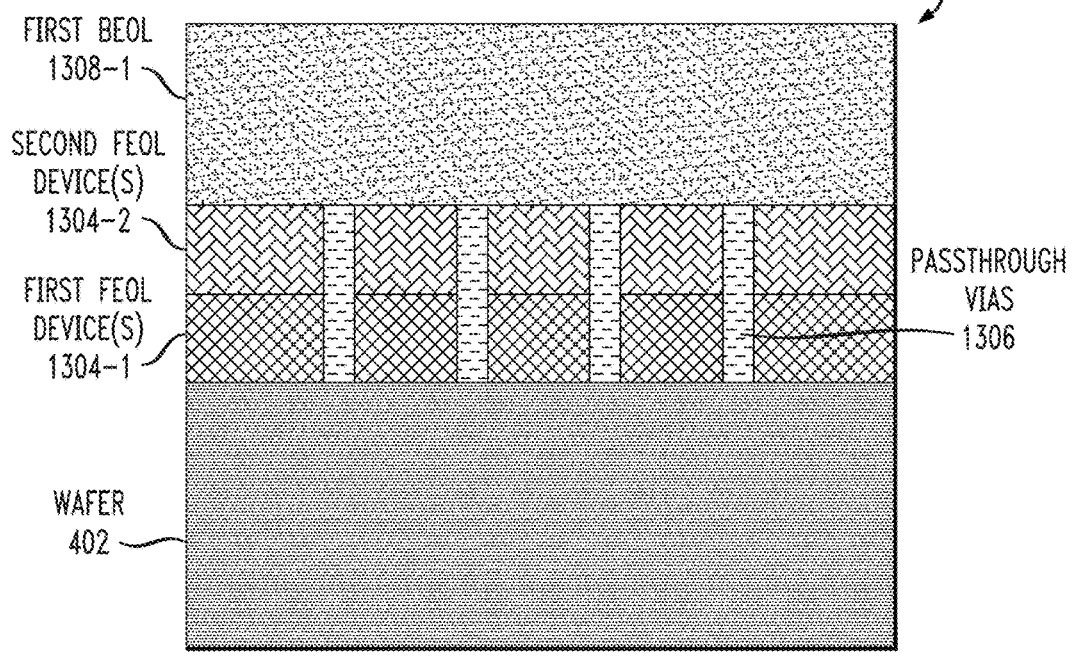
FIG. 15 depicts a side cross-sectional view of the FIG. 14 structure following formation of a first BEOL region on a first side of the stacked FEOL region, according to an embodiment of the invention.

FIG. 15 shows a cross-sectional view 1500 following formation of a first BEOL region 1308-1 over the FEOL devices 1304-2. The first BEOL region 1308-1 illustratively includes BEOL interconnect wiring, C4 bump formation, etc. in a manner similar to that described above with respect to the first BEOL region 304-1 in structure 300.

Figure 16:
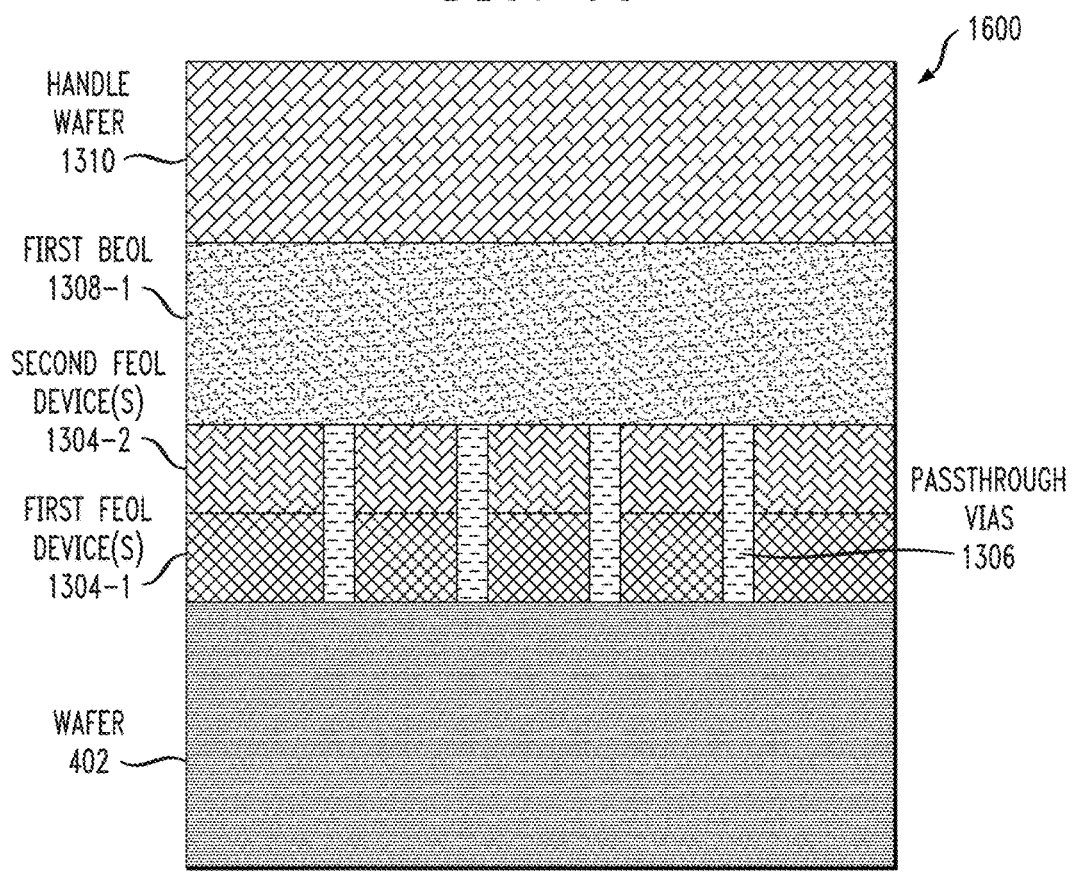
FIG. 16 depicts a side cross-sectional view of the FIG. 15 structure following bonding of a handle wafer to the first BEOL region, according to an embodiment of the invention.
Figure 17:
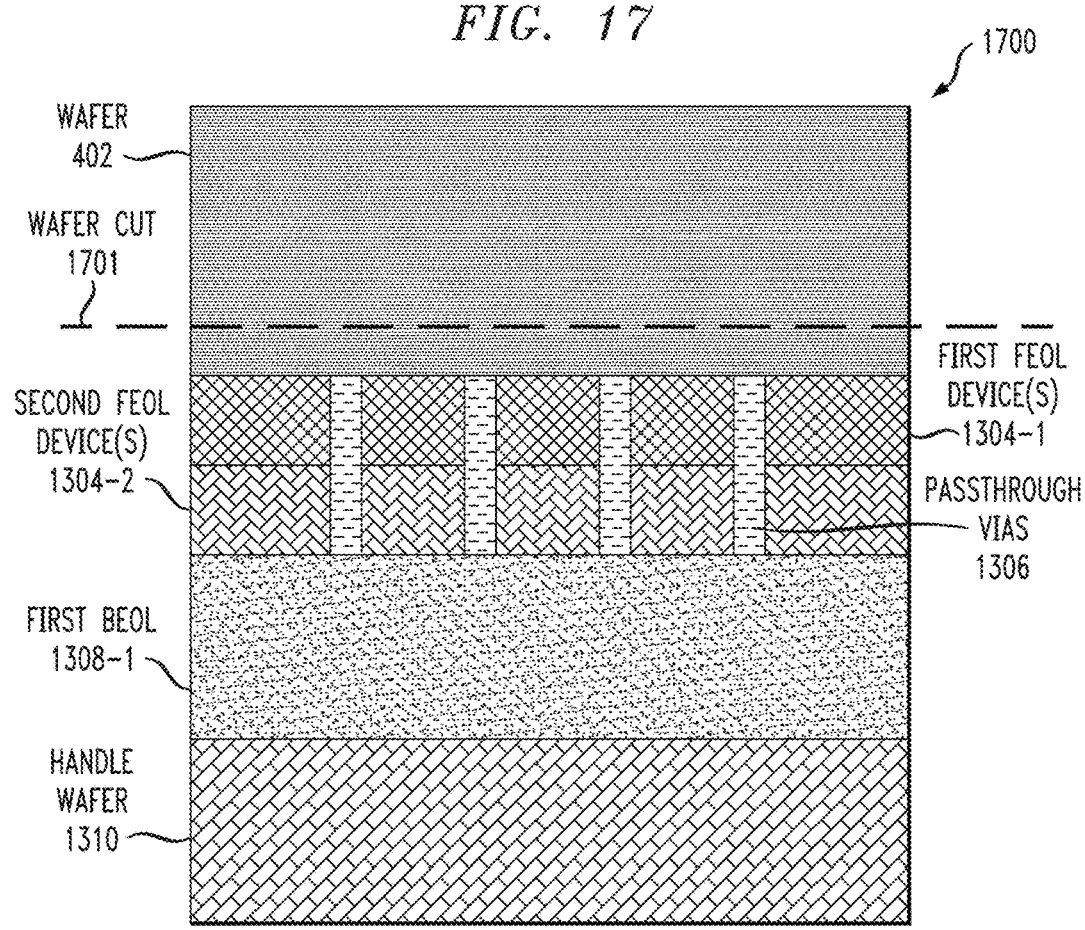
FIG. 17 depicts a side cross-sectional view of the FIG. 16 structure following flipping using the handle wafer, according to an embodiment of the invention.
Figure 18:
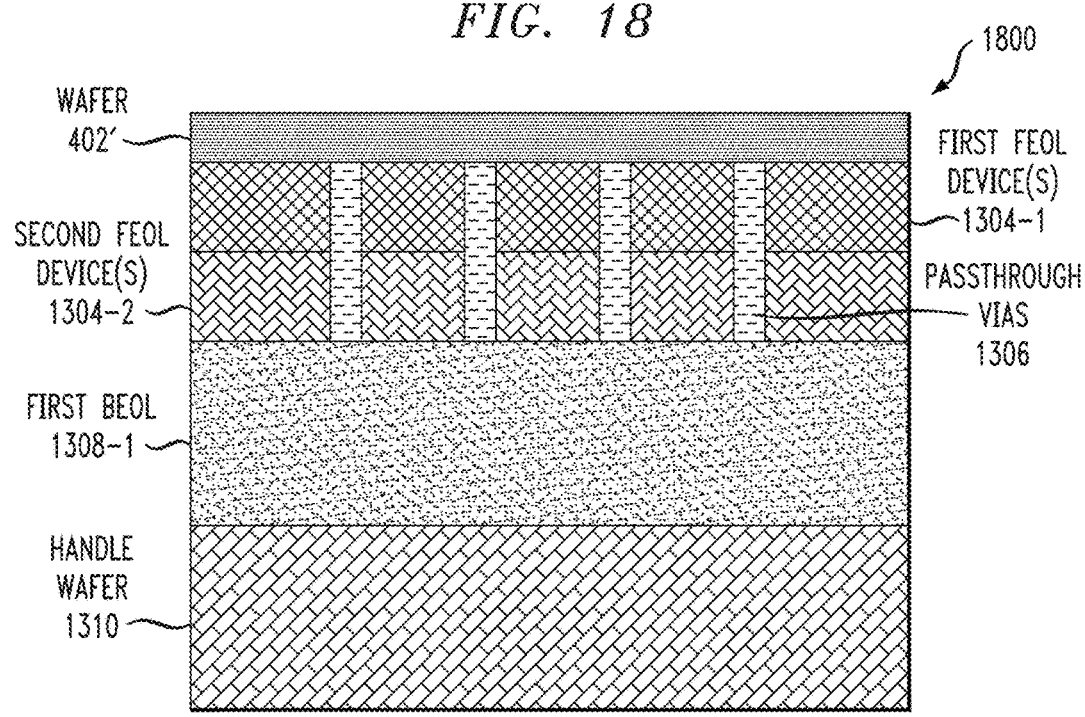
FIG. 18 depicts a side cross-sectional view of the FIG. 17 structure following cut of the wafer, according to an embodiment of the invention.
Figure 19:
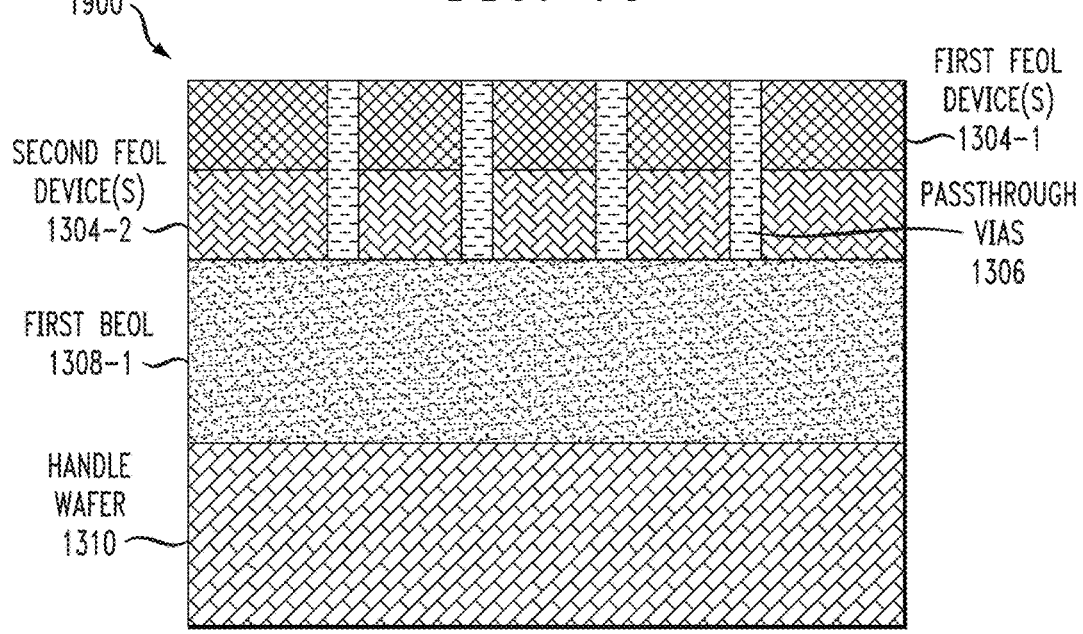
FIG. 19 depicts a side cross-sectional view of the FIG. 18 structure following thinning of remaining portions of the wafer, according to an embodiment of the invention.

FIG. 16 shows a cross-sectional view 1600 following bonding of a handle wafer 1310 to the first BEOL region 1308-1. As illustrated in the cross-sectional view 1700 of FIG. 17, the handle wafer 1310 is used to flip the wafer 402. FIG. 17 further illustrates a wafer cut line 1701. FIG. 18 shows a cross-sectional view 1800 following cutting of the wafer 402 along the wafer cut line 1701, resulting in wafer 402'. FIG. 19 shows a cross-sectional view 1900 following thinning down to remove remaining portions of the wafer 402'.

Figure 20:
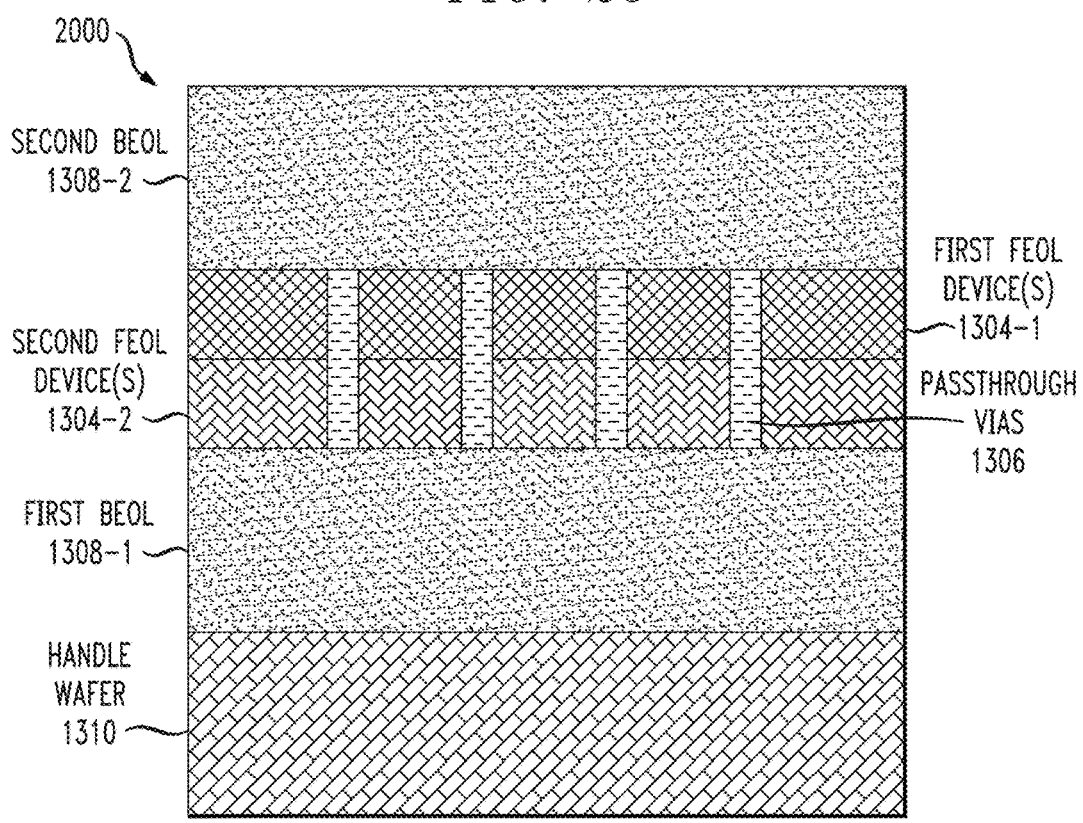
FIG. 20 depicts a side cross-sectional view of the FIG. 19 structure following formation of a second BEOL region on a second side of the FEOL region, according to an embodiment of the invention.

Following removal of the remaining portions of the wafer 402', a second BEOL region 1308-2 is formed as shown in the cross-sectional view 2000 of FIG. 20. The second BEOL region 1308-2 illustratively includes BEOL interconnect wiring, C4 bump formation, etc. in a manner similar to that described above with respect to the second BEOL region 304-2 in structure 300. The passthrough vias 1306 provide for interconnection between wiring in the first BEOL region 1308-1 and the second BEOL region 1308-2.

Semiconductor devices and methods for forming the same in accordance with the above-described techniques can be employed in various applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings provided herein, one of ordinary skill in the art will be able to contemplate other implementations and applications of embodiments of the invention.

In some embodiments, the above-described techniques are used in connection with semiconductor devices that may require or otherwise utilize, for example, complementary metal-oxide-semiconductors (CMOSs), metal-oxide-semiconductor field-effect transistors (MOSFETs), and/or fin field-effect transistors (FinFETs). By way of non-limiting example, the semiconductor devices can include, but are not limited to CMOS, MOSFET, and FinFET devices, and/or semiconductor devices that use CMOS, MOSFET, and/or FinFET technology.

Various structures described above may be implemented in integrated circuits. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either: (a) an intermediate product, such as a motherboard, or (b) an end product. The end product can be any product that includes integrated circuit chips, ranging from toys and other low-end applications to advanced computer products having a display, a keyboard or other input device, and a central processor.

In some embodiments, a semiconductor structure comprises a FEOL region comprising two or more devices. The semiconductor structure also comprises a first BEOL region on a first side of the FEOL region, the first BEOL region comprising a first set of interconnects for at least a first subset of the two or more devices in the FEOL region. The semiconductor structure further comprises a second BEOL region on a second side of the FEOL region opposite the first side of the FEOL region, the second BEOL region comprising a second set of interconnects for at least a second subset of the two or more devices in the FEOL region. The semiconductor structure further comprises one or more passthrough vias disposed in the FEOL region, each of the one or more passthrough vias connecting at least one of the first set of interconnects of the first BEOL region to at least one of the second set of interconnects of the second BEOL region.

The first subset of the two or more devices in the FEOL region may be the same or different than the second subset of the two or more devices in the FEOL region. For example, the first and second subsets of the two or more devices in the FEOL region may include distinct devices in the FEOL region, the same devices in the FEOL region, etc. In some embodiments, one or more devices are in both the first and second subsets, and one or more other devices may be unique to the first subset or the second subset. Various other combinations are possible.

At least one of the one or more passthrough vias may be self-aligned to at least one of the two or more devices in the FEOL region.

At least one of the one or more passthrough vias may be self-aligned to one or more dummy gate structures in the FEOL region.

At least one of the one or more passthrough vias may be disposed in a device to device boundary between first and second ones of the two or more devices in the FEOL region.

The first set of interconnects may be arranged in two or more wiring layers in the first BEOL region, and the two or more wiring layers in the first BEOL region may provide at least one of power and wire routing for at least the first subset of the two or more devices in the FEOL region. The second set of interconnects may be arranged in a wiring layer in the second BEOL region, and the wiring layer may provide a power rail for at least the second subset of the two or more devices in the FEOL region. The second set of interconnects may also or alternatively be arranged in two or more wiring layers in the second BEOL region, and the two or more wiring layers in the second BEOL region may provide at least one of power and wire routing for at least the second subset of the two or more devices in the FEOL region.

The two or more devices in the FEOL region comprise at least one of fin field-effect transistors and nanosheet transistors.

In some embodiments, a semiconductor structure comprises a stacked FEOL region, the stacked FEOL comprising a first FEOL region comprising two or more devices and a second FEOL region comprising two or more devices. The semiconductor structure also comprises a first BEOL region on a first side of the stacked FEOL region, the first BEOL region comprising a first set of interconnects for at least a first subset of the two or more devices in at least one of the first FEOL region and the second FEOL region of the stacked FEOL region. The semiconductor structure further comprises a second BEOL region on a second side of the stacked FEOL region opposite the first side of the stacked FEOL region, the second BEOL region comprising a second set of interconnects for at least a second subset of the two or more devices in at least one of the first FEOL region and the second FEOL region of the stacked FEOL region. The semiconductor structure further comprises one or more passthrough vias disposed in the stacked FEOL region, each of the one or more passthrough vias passing through the first FEOL region and the second FEOL region, at least one of the one or more passthrough vias connecting at least one of the first set of interconnects of the first BEOL region to at least one of the second set of interconnects of the second BEOL region.

At least one of the one or more passthrough vias may be self-aligned to at least one of the two or more devices in at least one of the first FEOL region and the second FEOL region.

At least one of the one or more passthrough vias may be self-aligned to one or more dummy gate structures in at least one of the first FEOL region and the second FEOL region.

At least one of the one or more passthrough vias may be disposed in a device to device boundary between first and second ones of the two or more devices in at least one of the first FEOL region and the second FEOL region.

The two or more devices of the first FEOL region may comprise devices of a first type, and the two or more devices of the second FEOL region may comprise devices of a second type different than the first type. The devices of the first type may comprise one of NFET devices and PFET devices, and the devices of the second type may comprise the other one of NFET devices and PFET devices.

At least one of the passthrough vias may connect at least one of the two or more devices in the first FEOL region with at least one of the two or more devices in the second FEOL region.

At least one of the passthrough vias may connect three or more of: at least one of the two or more devices in the first FEOL region; at least one of the two or more devices in the second FEOL region; at least one of the first set of interconnects of the first BEOL region; and at least one of the second set of interconnects of the second BEOL region.

In some embodiments, an integrated circuit comprises a semiconductor structure comprising two or more devices, a first set of interconnects for the two or more devices on a first side of the semiconductor structure, a second set of interconnects for the two or more devices on a second side of the semiconductor structure opposite the first side of the semiconductor structure, and one or more passthrough vias disposed in the semiconductor structure. At least one of the one or more passthrough vias extends from the first side of the semiconductor structure to the second side of the semiconductor structure and connects one or more first interconnects on a first side of the semiconductor structure and one or more second interconnects on a second side of the semiconductor structure opposite the first side of the semiconductor structure.

The one or more passthrough vias may be self-aligned to boundaries of the two or more devices in the semiconductor structure.

The semiconductor structure may comprise a first region comprising a first subset of the two or more devices of a first type and a second region comprising a second subset of the two or more devices of a second type. At least one of the passthrough vias may connect at least one of the devices in the first subset and at least one of the devices in the second subset.

In some embodiments, a method comprises forming two or more devices in a semiconductor structure, forming one or more passthrough vias in the semiconductor structure, forming a first set of interconnects on a first side of the semiconductor structure, and forming a second set of interconnects on a second side of the semiconductor structure. At least one of the one or more passthrough vias connects at least one of the first set of interconnects and at least one of the second set of interconnects.

The two or more devices in the semiconductor structure and the one or more passthrough vias may be formed as part of FEOL processing for an integrated circuit comprising the semiconductor structure, and the first set of interconnects and the second set of interconnects may be formed as part of BEOL processing for the integrated circuit comprising the semiconductor structure.

The semiconductor structure may be formed on a first side of a first wafer, and forming the second set of interconnects on the second side of the semiconductor structure may comprise bonding a second wafer to the first set of interconnects, performing a wafer flip of the first wafer using the second wafer as a handling wafer, cutting the first wafer, thinning remaining portions of the first wafer to expose the second side of the semiconductor structure, and forming the second set of interconnects on the second side of the semiconductor structure.

In some embodiments, a method comprises performing first FEOL processing to form two or more devices in a first FEOL region of a semiconductor structure and performing second FEOL processing to form two or more devices in a second FEOL region of the semiconductor structure. The method also comprises forming one or more passthrough vias in the first FEOL region of the semiconductor structure and the second FEOL region of the semiconductor structure. The method further comprises performing first BEOL processing to form a first set of interconnects on a first side of the semiconductor structure, and performing second BEOL processing to form a second set of interconnects on a second side of the semiconductor structure opposite the first side of the semiconductor structure. At least one of the one or more passthrough vias connects at least one of the first set of interconnects and at least one of the second set of interconnects.

The two or more devices in the first FEOL region may comprise devices of a first type, and the two or more devices in the second FEOL region may comprise devices of a second type. The devices of the first type may comprise one of NFET devices and PFET devices, and the devices of the second type may comprise the other one of NFET devices and PFET devices.

It should be understood that the various layers, structures, and regions shown in the figures are schematic illustrations that are not drawn to scale. In addition, for ease of explanation, one or more layers, structures, and regions of a type commonly used to form semiconductor devices or structures may not be explicitly shown in a given figure. This does not imply that any layers, structures, and regions not explicitly shown are omitted from the actual semiconductor structures. Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

Moreover, the same or similar reference numbers are used throughout the figures to denote the same or similar features, elements, or structures, and thus, a detailed explanation of the same or similar features, elements, or structures are not repeated for each of the figures. It is to be understood that the terms "approximately" or "substantially" as used herein with regard to thicknesses, widths, percentages, ranges, temperatures, times and other process parameters, etc., are meant to denote being close or approximate to, but not exactly. For example, the term "approximately" or "substantially" as used herein implies that a small margin of error is present, such as ±5%, preferably less than 2% or 1% or less than the stated amount.

In the description above, various materials, dimensions and processing parameters for different elements are provided. Unless otherwise noted, such materials are given by way of example only and embodiments are not limited solely to the specific examples given. Similarly, unless otherwise noted, all dimensions and process parameters are given by way of example and embodiments are not limited solely to the specific dimensions or ranges given.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor structure comprising:
   a front-end-of-line region comprising two or more devices;
   a first back-end-of-line region on a first side of the front-end-of-line region, the first back-end-of-line region comprising a first set of interconnects for at least a first subset of the two or more devices in the front-end-of-line region;
   a second back-end-of-line region on a second side of the front-end-of-line region opposite the first side of the front-end-of-line region, the second back-end-of-line region comprising a second set of interconnects for at least a second subset of the two or more devices in the front-end-of-line region; and
   one or more passthrough vias disposed in the front-end-of-line region, each of the one or more passthrough vias connecting at least one of the first set of interconnects of the first back-end-of-line region to at least one of the second set of interconnects of the second back-end-of-line region.

2. The semiconductor structure of claim 1, wherein at least one of the one or more passthrough vias is self-aligned to at least one of the two or more devices in the front-end-of-line region.

3. The semiconductor structure of claim 1, wherein at least one of the one or more passthrough vias is self-aligned to one or more dummy gate structures in the front-end-of-line region.

4. The semiconductor structure of claim 1, wherein at least one of the one or more passthrough vias is disposed in a device to device boundary between first and second ones of the two or more devices in the front-end-of-line region.

5. The semiconductor structure of claim 1, wherein the first set of interconnects are arranged in two or more wiring layers in the first back-end-of-line region, and wherein the two or more wiring layers in the first back-end-of-line region provide at least one of power and wire routing for at least the first subset of the two or more devices in the front-end-of-line region.

6. The semiconductor structure of claim 5, wherein the second set of interconnects are arranged in a wiring layer in the second back-end-of-line region, and wherein the wiring layer provides a power rail for at least the second subset of the two or more devices in the front-end-of-line region.

7. The semiconductor structure of claim 5, wherein the second set of interconnects are arranged in two or more wiring layers in the second back-end-of-line region, and wherein the two or more wiring layers in the second back-end-of-line region provide at least one of power and wire routing for at least the second subset of the two or more devices in the front-end-of-line region.

8. The semiconductor structure of claim 1, wherein the two or more devices in the front-end-of-line region comprise at least one of fin field-effect transistors and nanosheet transistors.

* * * * *